(12) United States Patent
Chen (10) Patent No.: US 10,026,373 B2
(45) Date of Patent: Jul. 17, 2018

(54) GATE DRIVE CIRCUIT, DISPLAY PANEL AND TOUCH DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Xi Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 99 days.

(21) Appl. No.: 15/104,380

(22) PCT Filed: Oct. 30, 2015

(86) PCT No.: PCT/CN2015/093390
§ 371 (c)(1),
(2) Date: Jun. 14, 2016

(87) PCT Pub. No.: WO2016/176972
PCT Pub. Date: Nov. 10, 2016

(65) Prior Publication Data
US 2017/0124976 A1    May 4, 2017

(30) Foreign Application Priority Data
May 7, 2015    (CN) .......................... 2015 1 0229369

(51) Int. Cl.
*G09G 3/36*    (2006.01)
*G06F 3/041*   (2006.01)
*G11C 19/00*   (2006.01)

(52) U.S. Cl.
CPC ......... *G09G 3/3677* (2013.01); *G06F 3/0412* (2013.01); *G06F 3/0416* (2013.01);
(Continued)

(58) Field of Classification Search
CPC .......... G06F 3/0412; G09G 2310/0286; G09G 2310/08; G09G 3/3674; G09G 2310/0267;
(Continued)

(56) References Cited

U.S. PATENT DOCUMENTS 8,929,506 B2 *  1/2015  Ma ........................ G11C 19/28
                                                        377/64
9,530,370 B2 * 12/2016  Yang ................... G09G 3/3677
(Continued)

FOREIGN PATENT DOCUMENTS

CN        1499272 A       5/2004
CN      101013209 A       8/2007
(Continued)

OTHER PUBLICATIONS

Chinese Office Action dated Oct. 10, 2016.
Search Report and Written Opinion dated Feb. 15, 2016 from State Intellectual Property Office of the P.R. China.

*Primary Examiner* — Sanjiv D Patel
(74) *Attorney, Agent, or Firm* — Dilworth & Barrese, LLP.; Michael J. Musella, Esq.

(57) ABSTRACT

There is provided a gate drive circuit, a display panel and a touch display apparatus. The gate drive circuit includes gate drive sub-circuits (1) of at least two stages, the gate drive sub-circuit of each stage including a plurality of shift registers (SR(1), SR(2), . . . , SR(N)) connected in cascade. In gate drive sub-circuit of each stage except the last stage, a signal output terminal of a shift register (SR(N)) of a last stage is connected with an input signal control terminal of a shift register (SR(1)) of a first stage in a gate drive sub-
(Continued)

circuit of a next stage adjacent thereto via a voltage maintaining unit (2). The voltage maintaining unit (2) is configured to maintain, after a shift register of a last stage (SR(N)) in the gate drive sub-circuit of the previous stage connected thereto outputs the gate drive signal and before a shift register of a first stage(SR(1)) in the gate drive sub-circuit of the next stage connected thereto outputs the gate drive signal, the potential of an input signal control terminal of the shift register of the first stage in the gate drive sub-circuit of the next stage to be equal to the potential of the gate drive signal, so that the potential of the input signal control terminal does not attenuate with time, assuring that respective gate drive sub-circuits can output the signals normally.

16 Claims, 7 Drawing Sheets

(52) U.S. Cl.
CPC ..... *G11C 19/00* (2013.01); *G09G 2310/0286* (2013.01); *G09G 2310/08* (2013.01); *G09G 2320/0223* (2013.01)

(58) Field of Classification Search
CPC ......... G09G 2310/0289; G09G 3/3696; G09G 2310/061; G09G 3/3266; G09G 2310/06; G09G 2320/0223; G11C 19/18; G11C 27/04; G11C 11/4085; G11C 8/08; G11C 5/145; G11C 5/147; G11C 29/021

USPC .............................................. 377/60, 68, 70
See application file for complete search history.

(56) References Cited

U.S. PATENT DOCUMENTS

| | | | |
|---|---|---|---|
| 2004/0085281 A1* | 5/2004 | Chung ................ | G09G 3/3611 345/98 |
| 2006/0269038 A1 | 11/2006 | Jang et al. | |
| 2013/0241814 A1* | 9/2013 | Hirabayashi ......... | G09G 3/3677 345/100 |
| 2014/0049512 A1* | 2/2014 | Yang ..................... | G06F 3/0412 345/174 |
| 2014/0079173 A1* | 3/2014 | Yan ........................ | G11C 19/28 377/64 |
| 2015/0116305 A1 | 4/2015 | Chung et al. | |
| 2015/0131771 A1* | 5/2015 | Hu ........................... | G09G 3/20 377/68 |
| 2015/0317018 A1* | 11/2015 | Lin ......................... | G11C 19/28 345/173 |
| 2017/0132967 A1* | 5/2017 | Liu ........................ | G09G 3/2092 |

FOREIGN PATENT DOCUMENTS

| | | |
|---|---|---|
| CN | 101017263 A | 8/2007 |
| CN | 103021309 A | 4/2013 |
| CN | 104505046 A | 4/2015 |
| CN | 104517556 A | 4/2015 |
| CN | 104821159 A | 8/2015 |

\* cited by examiner

GATE DRIVE CIRCUIT, DISPLAY PANEL AND TOUCH DISPLAY APPARATUS

TECHNICAL FIELD OF THE DISCLOSURE

The present disclosure relates to the field of display technology, and in particular to a gate drive circuit, a display panel and a touch display apparatus.

BACKGROUND

In a thin film transistor(Thin Film Transistor) display, generally, gates of respective TFTs of a pixel region are provided with gate drive signals from a gate drive circuit. The gate drive circuit may be formed on an array substrate of a liquid crystal display by an array process, that is, GOA (Gate driver on Array) process. Such an integration process not only saves the cost, but also can achieve an aesthetic design for symmetry on both sides of a liquid crystal panel while omitting the Bonding region of a gate IC (Integrated Circuit) and the wiring space for Fan-out, thus realizing a design of narrow bezel.

Figure 1:
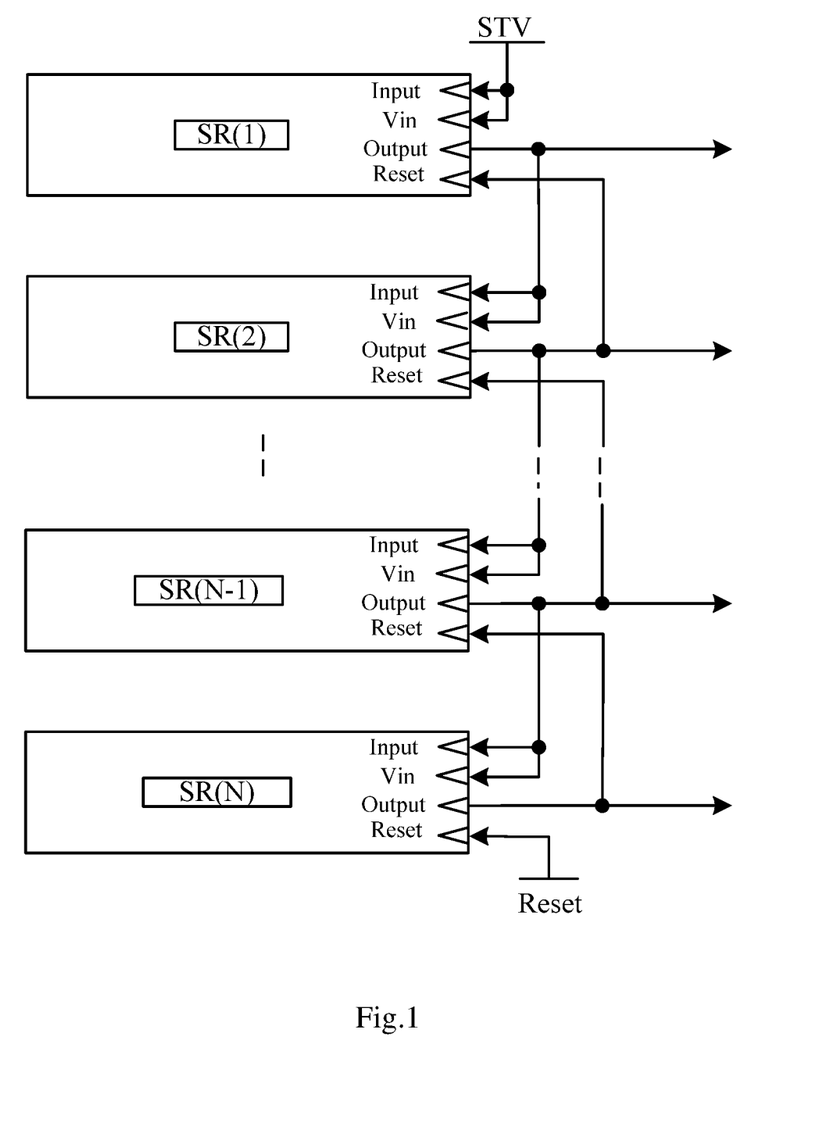
FIG. 1 is a structural diagram of an existing gate drive circuit.

An existing GOA circuit, as illustrated in FIG. 1, consists of multiple shift registers SR (1), SR (2), . . . SR (N). Each shift register SR (n) is used for providing a gate scan signal to a gate line connected with a signal output terminal Output of the shift register SR(n), inputting a reset signal to a reset signal terminal Reset of the previous shift register SR (n−1) adjacent thereto, inputting an input signal to an input signal terminal Input and an input signal control terminal Vin of the subsequent shift register SR (n+1) adjacent thereto, and outputting a gate drive signal when the input signal is received by the input signal control terminal Vin and the input signal terminal Input of shift register SR (n) of each stage.

However, when the display needs to divide the time for displaying one frame of picture into multiple periods of time and a time internal of a certain duration is needed between respective the periods of time, the input signal would be attenuated in the above GOA circuit between respective the periods of time, and the longer the time interval is, the more severe the input signal would be attenuated, thus causing the output of the entire GOA circuit in abnormal status.

Therefore, how to prevent the signal from being attenuated in the GOA circuit within a preset time interval is a technical problem to be solved urgently by those skilled in the art.

SUMMARY

Embodiments of the present disclosure provide a gate drive circuit, a display panel and a touch display apparatus for avoiding, in the gate drive circuit, that the potential of the input signal control terminal of the shift register of the next stage is attenuated due to the relative large time intervals between the timings at which two adjacent shift registers output gate driving signals.

A gate drive circuit provided by an embodiment of the present disclosure comprises gate drive sub-circuits of at least two stages, the gate drive sub-circuit of each stage comprising a plurality of shift registers connected in cascade and configured to output gate drive signals in sequence at signal output terminals of shift registers of respective stages after a shift register of a first stage receives an input signal input from the corresponding input signal terminal;

in gate drive sub-circuit of each stage except the last stage, a signal output terminal of a shift register of a last stage is connected with an input signal control terminal of a shift register of a first stage in a gate drive sub-circuit of a next stage adjacent thereto via a voltage maintaining unit, wherein the voltage maintaining unit is configured to maintain, after a shift register of a last stage in the gate drive sub-circuit of the previous stage connected thereto outputs the gate drive signal and before a shift register of a first stage in the gate drive sub-circuit of the next stage connected thereto outputs the gate drive signal, the potential of an input signal control terminal of the shift register of the first stage in the gate drive sub-circuit of the next stage to be equal to the potential of the gate drive signal;

when the potential of the input signal control terminal of the shift register of each stage is equal to the potential of the gate drive signal, the shift register of each stage receives the input signal input from the corresponding input signal terminal In one possible implementation, in the above gate drive circuit provided by the embodiment of the present disclosure, the voltage maintaining unit specifically comprises an input module, a voltage stabilization module and a reset module, wherein a control terminal and an input terminal of the input module are both connected with the signal output terminal of the shift register of the last stage in the gate drive sub-circuit of the previous stage, and an output terminal of the input module is connected with a maintaining node, the maintaining node being connected with the input signal control terminal of the shift register of the first stage in the gate drive sub-circuit of the next stage; the input module is configured to provide, when the control terminal and the input terminal thereof receive the gate drive signal, the gate drive signal to the maintaining node;

a control terminal of the reset module is connected with the signal output terminal of the shift register of the first stage in the gate drive sub-circuit of the next stage, an input terminal of the reset module is connected with a reference signal terminal, and an output terminal of the reset module is connected with the maintaining node; the reset module is configured to provide, when the control terminal thereof receives the gate drive signal, a reference signal to the maintaining node;

a first terminal of the voltage stabilization module is connected with the maintaining node, and a second terminal of the voltage stabilization module is connected with the reference signal terminal; the voltage stabilization module is configured to maintain, after the maintaining node receives the gate drive signal and before the maintaining node receives the reference signal, the potential of the maintaining node to be equal to the potential of the gate drive signal.

In one possible implementation, in the above gate drive circuit provided by the embodiment of the present disclosure, the input module specifically comprises a first switching transistor, wherein a gate of the first switching transistor is the control terminal of the input module, a source of the first switching transistor is the input terminal of the input module, and a drain of the first switching transistor is the output terminal of the input module.

Optionally, in the above gate drive circuit provided by the embodiment of the present disclosure, the first switching transistor is an N-type transistor in a case that the active potential of the gate drive signal is high and is a P-type transistor in a case that the active potential of the gate drive signal is low.

In one possible implementation, in the above gate drive circuit provided by the embodiment of the present disclosure, the voltage stabilization module is specifically a capacitor, wherein one electrode of the capacitor is the first terminal of the voltage stabilization module, and the other electrode of the capacitor is the second terminal of the voltage stabilization module.

In one possible implementation, in the above gate drive circuit provided by the embodiment of the present disclosure, the reset module specifically comprises a second switching transistor, wherein a gate of the second switching transistor is the control terminal of the reset module, a source of the second switching transistor is the input terminal of the reset module, and a drain of the second switching transistor is the output terminal of the reset module.

Optionally, in the above gate drive circuit provided by the embodiment of the present disclosure, the second switching transistor is an N-type transistor in a case that the active potential of the gate drive signal is high and is a P-type transistor in a case that the active potential of the gate drive signal is low.

Optionally, in the above gate drive circuit provided by the embodiment of the present disclosure, the potential of the reference signal terminal is low in a case that the active potential of the gate drive signal is high and is high in a case that the active potential of the gate drive signal is low.

Optionally, in the above gate drive circuit provided by the embodiment of the present disclosure, in the gate drive sub-circuit of each stage, the signal output terminal of the shift register of each stage except the first stage is connected with the reset signal terminal of the shift register of the previous stage adjacent thereto;

the signal output terminal of the shift register of each stage except the last stage is connected with the input signal control terminal and the input signal terminal of the shift register of the next stage adjacent thereto;

the input signal terminal corresponding to the shift register of the first stage is connected with a start signal terminal, and the reset signal terminal of the shift register of the last stage is connected with a termination signal terminal.

Accordingly, an embodiment of the present disclosure further provides a display panel comprising any one of the above gate drive circuit provided by the embodiment of the present disclosure.

Optionally, the above display panel provided by the embodiment of the present disclosure further comprises a plurality of touch scan lines and a touch scan circuit connected with respective touch scan lines; the display panel is divided into N regions along the scan direction of the touch scan lines, and each of regions has a plurality of touch scan lines, N being equal to the number of stages of gate drive sub-circuits in the display panel;

the touch scan circuit is configured to output, after a shift register of a last stage in the gate drive sub-circuit of the n-th stage outputs a gate drive signal and before a shift register of a first stage in the gate drive sub-circuit of the (n+1)-th stage outputs the gate drive signal, touch scan signals to touch scan lines in the n-th region in sequence, and to output touch scan signals to touch scan lines in the N-th region in sequence after a shift register of a last stage in the gate drive sub-circuit of the N-th stage outputs the gate drive signal, n being a positive integer greater than 0 and less than N.

Accordingly, an embodiment of the present disclosure further provides a touch display apparatus comprising the above display panel provided by the embodiment of the present disclosure.

In the above gate drive circuit, display panel and display apparatus provided by the embodiments of the present disclosure, since the voltage maintaining unit is arranged between gate drive sub-circuits of two adjacent stages to maintain, after the shift register of the last stage in the gate drive sub-circuit of the previous stage connected thereto outputs the gate drive signal and before the shift register of the first stage in the gate drive sub-circuit of the next stage connected thereto outputs the gate drive signal, the potential of the input signal control terminal of the shift register of the first stage in the gate drive sub-circuit of the next stage to be equal to the potential of the gate drive signal, it is assured, in the gate drive circuit, the potential of the input signal control terminal of the shift register of the first stage in the gate drive sub-circuit of the next stage cannot be attenuated with time regardless how long the time interval between the timings at which the gate drive sub-circuits of two adjacent stages output gate drive signals is; instead, the potential of the input signal control terminal thereof is maintained to be equal to the potential of the gate drive signal. Thereby, it is assured that respective gate drive sub-circuits in the gate drive circuit can output the signals normally.

DETAILED DESCRIPTION

In the following, specific implementations of a gate drive circuit, a display panel and a touch display apparatus provided by embodiments of the present disclosure are explained in detail in conjunction with attached drawings.

Figure 2:
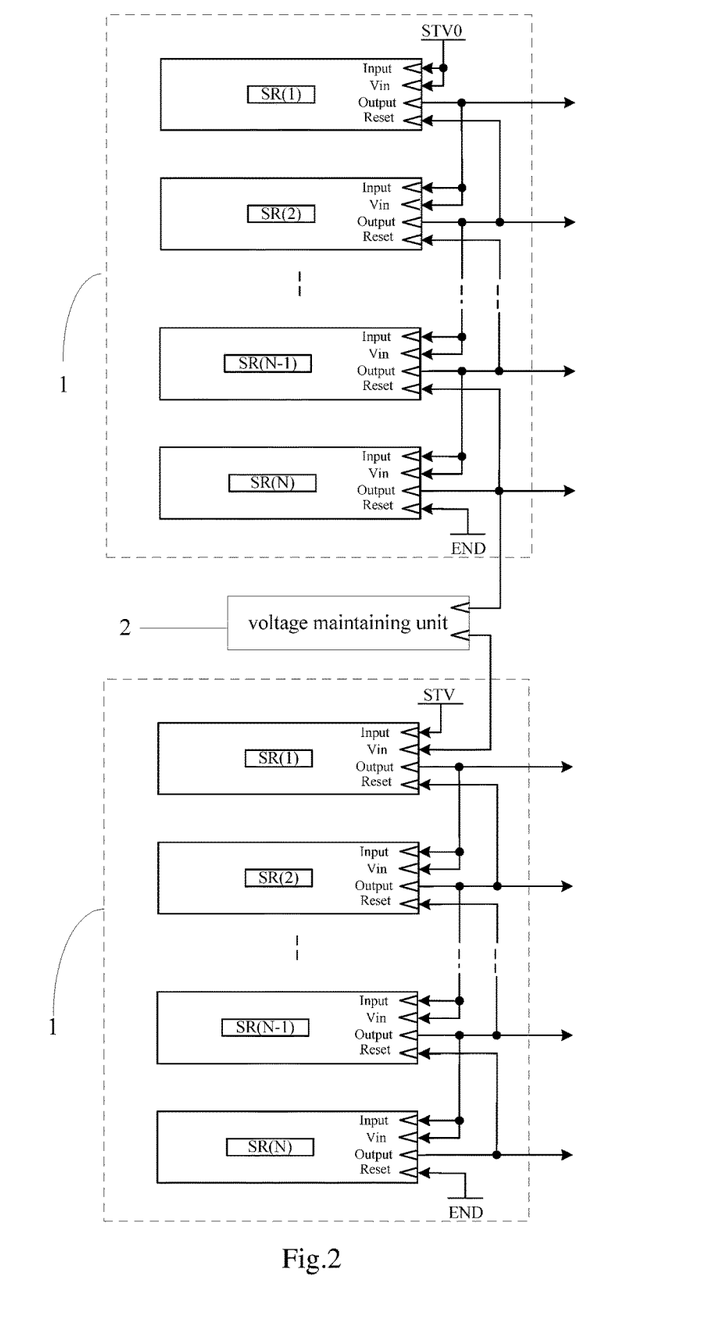
FIG. 2 is a schematic diagram of the structure of a gate drive circuit provided by an embodiment of the present disclosure.

An embodiment of the present disclosure provides a gate drive circuit, as illustrated in FIG. 2, which includes gate drive sub-circuits 1 of at least two stages (in FIG. 2, gate drive sub-circuits of two stages are taken as an example). The gate drive sub-circuit 1 of each stage includes multiple shift registers connected in cascade, that is, SR(1), SR(2) . . . SR(n) . . . SR(N−1), SR(N) (N shift registers in total, $1 \leq n \leq$), wherein signal output terminals Output of shift registers of respective stages output gate drive signals in sequence after a shift register SR(1) of a first stage receives an input signal input from the corresponding input signal terminal Input.

In gate drive sub-circuit 1 of each stage except the last stage, a signal output terminal Output of a shift register SR(N) of a last stage is connected with an input signal control terminal Vin of a shift register SR(1) of a first stage in a gate drive sub-circuit 1 of a next stage adjacent thereto via a voltage maintaining unit 2.

The voltage maintaining unit 2 is used to maintain, after a shift register SR(N) of a last stage in the gate drive sub-circuit 1 of the previous stage connected thereto outputs the gate drive signal and before a shift register SR(1) of a first stage in the gate drive sub-circuit 1 of the next stage connected thereto outputs the gate drive signal, the potential of an input signal control terminal Vin of the shift register SR(1) of the first stage in the gate drive sub-circuit 1 of the next stage to be at the potential of the gate drive signal;

when the potential of the input signal control terminal Vin of the shift register of each stage is equal to the potential of the gate drive signal, the shift register and the corresponding input signal terminal Input are in a state of conduction.

In the above gate drive circuit provided by the embodiment of the present disclosure, since the voltage maintaining unit is arranged between gate drive sub-circuits of two adjacent stages to maintain, after the shift register of the last stage in the gate drive sub-circuit of the previous stage connected thereto outputs the gate drive signal and before the shift register of the first stage in the gate drive sub-circuit of the next stage connected thereto outputs the gate drive signal, the potential of the input signal control terminal of the shift register of the first stage in the gate drive sub-circuit of the next stage to be at the potential of the gate drive signal, guaranteeing that, in the gate drive circuit, the potential of the input signal control terminal of the shift register of the first stage in the gate drive sub-circuit of the next stage can not be attenuated with time regardless how long the time interval between the timings at which the gate drive sub-circuits of two adjacent stages output gate drive signals is; instead, the potential of the input signal control terminal thereof is maintained at the potential of the gate drive signal. Thereby, it is assured that respective gate drive sub-circuits in the gate drive circuit can output the signals normally.

Specifically, in a specific implementation, in the above gate drive circuit provided by the embodiment of the present disclosure, as illustrated in FIG. 2, in the gate drive sub-circuit 1 of each stage, in the shift register SR(n) of each stage except the shift register SR(1) of the first stage, the signal output terminal Output is connected with the reset signal terminal Reset of the shift register SR(n−1) of the previous stage adjacent thereto; in the shift register SR(n) of each stage except the shift register SR(N) of the last stage, the signal output terminal Output is connected with the input signal control terminal Vin and the input signal terminal Input of the shift register SR(n+1) of the next stage adjacent thereto; the input signal terminal Input corresponding to the shift register SR(1) of the first stage is connected with a start signal terminal STV, and the reset signal terminal Reset of the shift register of the last stage is connected with a termination signal terminal END.

Further, in the above gate drive circuit provided by the embodiment of the present disclosure, as illustrated in FIG. 2, the input signal control terminal Vin of the shift register SR(1) of the first stage in the gate drive sub-circuit 1 of the first stage is connected with a frame start signal terminal STV0, and the start signal terminal STV corresponding to the shift register of the first stage and the frame start signal terminal STV0 are a same signal terminal.

In the following, the present disclosure is explained in detail in conjunction with specific embodiments. It should be noted that the present embodiment is for the purpose of better explaining, but not limiting, the present disclosure.

Figure 3:
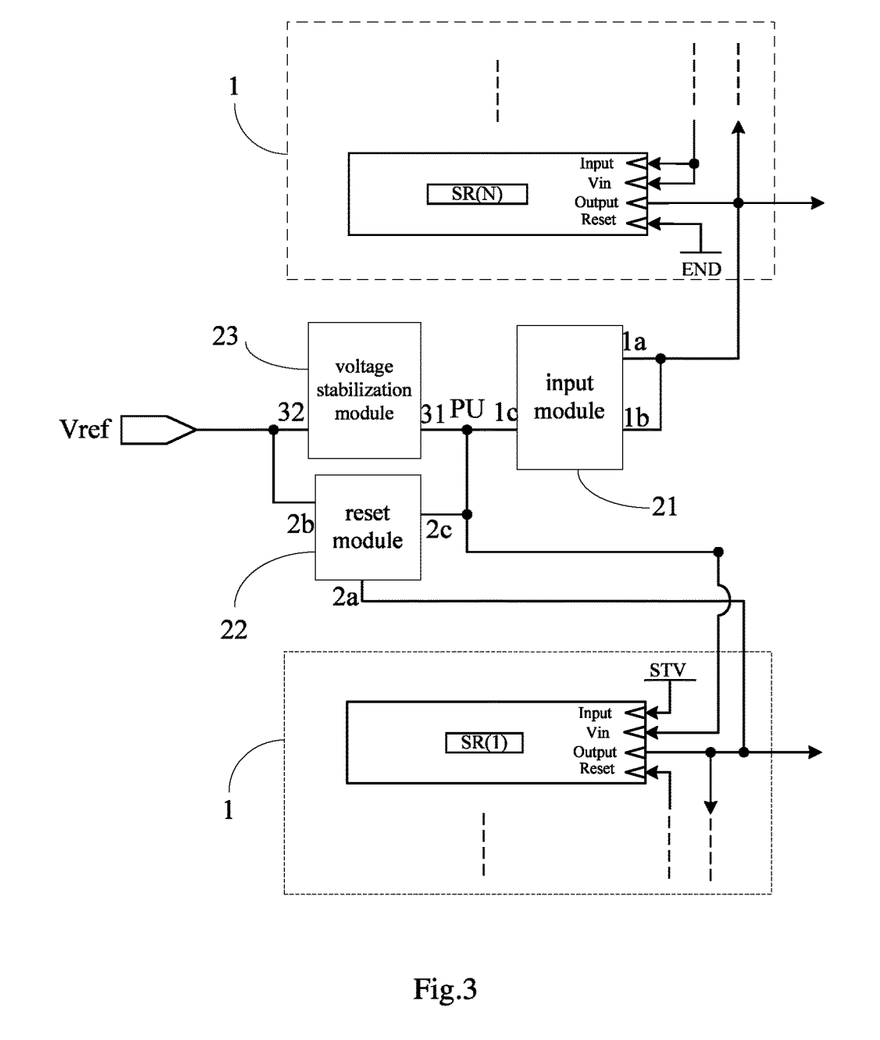
FIG. 3 is a schematic diagram of the structure of an voltage maintaining unit provided by an embodiment of the present disclosure.

Specifically, in the above gate drive circuit provided by the embodiment of the present disclosure, as illustrated in FIG. 3, the voltage maintaining unit 2 may specifically include an input module 21, a voltage stabilization module 23 and a reset module 22.

A control terminal 1a and an input terminal 1b of the input module 21 are both connected with the signal output terminal Output of the shift register SR(N) of the last stage in the gate drive sub-circuit 1 of the previous stage, and an output terminal 1c of the input module 21 is connected with a maintaining node PU, the maintaining node PU being connected with the input signal control terminal Vin of the shift register SR(1) of the first stage in the gate drive sub-circuit 1 of the next stage; the input module 21 is used to provide, when the control terminal 1a and the input terminal 1b thereof receive the gate drive signal, the gate drive signal to the maintaining node PU.

A control terminal 2a of the reset module 22 is connected with the signal output terminal Output of the shift register SR(1) of the first stage in the gate drive sub-circuit 1 of the next stage, an input terminal 2b of the reset module 22 is connected with a reference signal terminal Vref, and an output terminal 2c of the reset module 22 is connected with the maintaining node PU; the reset module 22 is used to provide, when the control terminal 2a thereof receives the gate drive signal, a reference signal to the maintaining node PU.

A first terminal 31 of the voltage stabilization module 23 is connected with the maintaining node PU, and a second terminal 32 of the voltage stabilization module 23 is connected with the reference signal terminal Vref; the voltage stabilization module 23 is used to maintain, after the maintaining node PU receives the gate drive signal and before receiving the reference signal, the potential of the maintaining node PU to be at the potential of the gate drive signal.

Specifically, in the above gate drive circuit provided by the embodiment of the present disclosure, for each voltage maintaining unit, when the signal output terminal of the shift register of the last stage in the gate drive sub-circuit of the previous stage connected thereto outputs the gate drive signal, the control terminal and the input terminal of the input module receive the gate drive signal and provide the same to the maintaining node. Thereafter, under the effect of the voltage stabilization module, the potential of the maintaining node does not attenuate and is still equal to the potential of the gate drive signal. Since the maintaining node is connected with the input signal control terminal of the shift register of the first stage in the gate drive sub-circuit of the next stage, the potential of the input signal control terminal of the shift register of the first stage in the gate drive sub-circuit of the next stage is also maintained at the potential of the gate drive signal, so as to assure that the shift register of the first stage in the gate drive sub-circuit of the next stage can stably output the signal after receiving the input signal. After the shift register of the first stage in the gate drive sub-circuit of the next stage receives the input signal input from the corresponding input signal terminal, the signal output terminal of the shift register of the first stage stably outputs the gate drive signal so that the reset module provides the reference signal to the maintaining node so as to reset the potential of the maintaining node to be equal to the potential of the reference signal, assuring that respective shift registers in the gate drive sub-circuit of the next stage output the signals normally. Thus, in the gate drive circuit, since there is the voltage maintaining unit arranged between two adjacent gate drive sub-circuits, even if the time interval between the timings at which gate drive sub-circuits of two stages output gate drive signals is relative large, the output of the gate drive sub-circuit of the next stage can not be affected, assuring that gate drive sub-circuits of respective stages in the gate drive circuit output the signals normally.

Further, in a specific implementation, in the above gate drive circuit provided by the embodiment of the present disclosure, the potential of the reference signal is opposite to that of the gate drive signal, that is, when the potential of the gate drive signal is high, the potential of the reference signal terminal is low; and when the potential of the gate drive signal is low, the potential of the reference signal terminal is high.

Figure 4A:
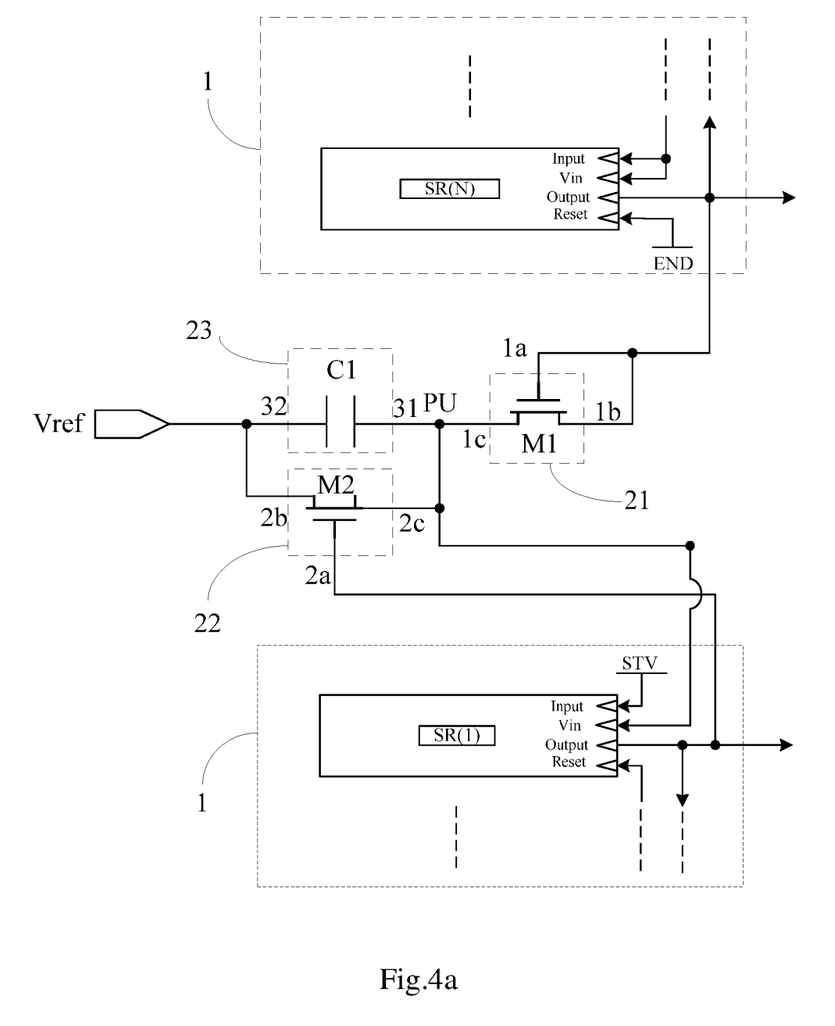
FIG. 4a is a schematic diagram of the specific structure of a voltage maintaining unit, in which all of switching transistors are N-type transistors, provided by an embodiment of the present disclosure.
Figure 4B:
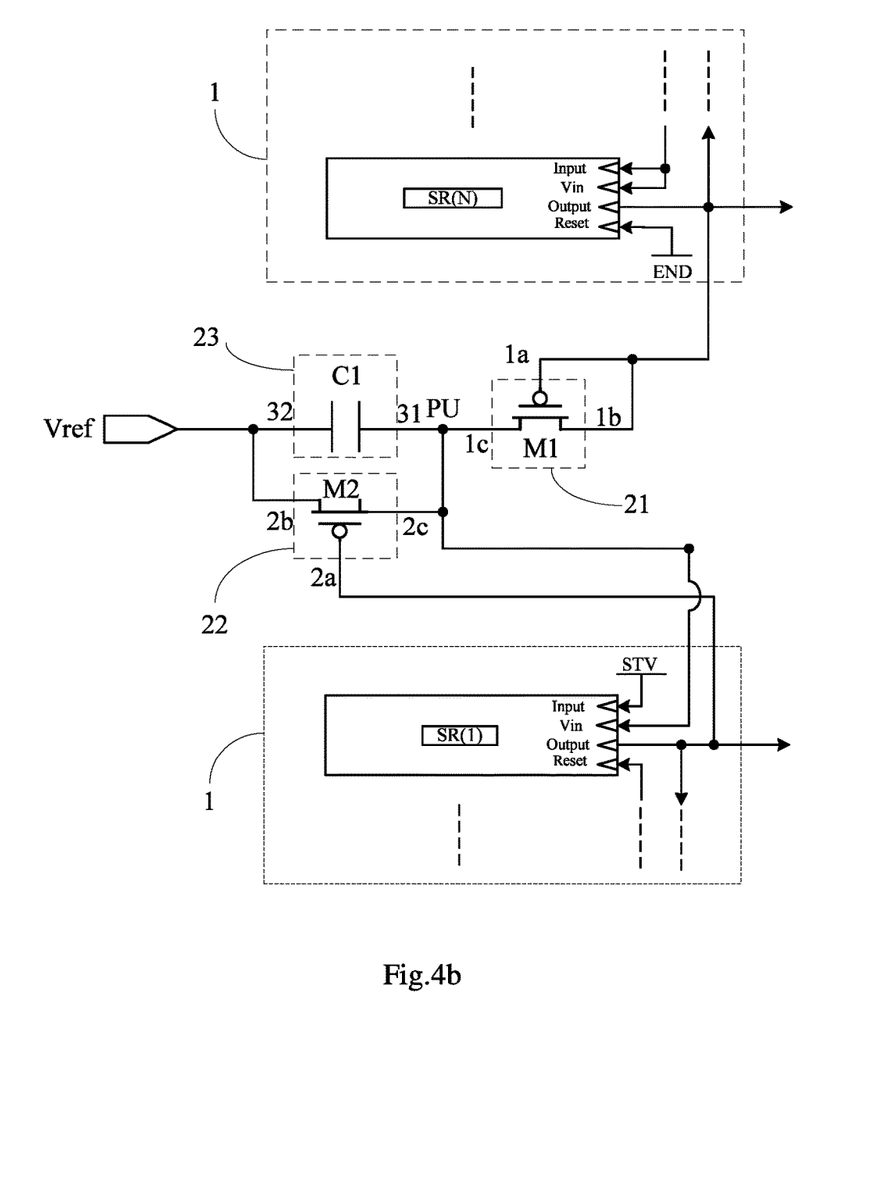
FIG. 4b is a schematic diagram of the specific structure of a voltage maintaining unit, in which all of switching transistors are P-type transistors, provided by an embodiment of the present disclosure.

Optionally, in the above gate drive circuit provided by the embodiment of the present disclosure, as illustrated in FIGS. 4a and 4b, the input module 21 can specifically includes a first switching transistor M1.

A gate of the first switching transistor M1 is the control terminal 1a of the input module 21, a source of the first switching transistor M1 is the input terminal 1b of the input module 21, and a drain thereof is the output terminal 1c of the input module 21.

Specifically, in the above gate drive circuit provided by the embodiment of the present disclosure, the first switching transistor is in a turned-on state upon receipt of the gate drive signal by the control terminal thereof, and thus provides the gate drive signal of the input terminal to a pull-up node, so that the pull-up node is at the potential of the gate drive signal.

Specifically, in the above gate drive circuit provided by the embodiment of the present disclosure, as illustrated in FIG. 4a, when the potential of the gate drive signal is high, the first switching transistor M1 is an N-type transistor, and, as illustrated in FIG. 4b, when the potential of the gate drive signal is low, the first switching transistor M1 is a P-type transistor.

The above only exemplifies the specific structure of the input module in the voltage maintaining unit. In a specific implementation, the specific structure of the input module is not limited to the above structure provided by the embodiment of the present disclosure, can also be other structures known to those skilled in the art and is not limited herein.

Optionally, in the above gate drive circuit provided by the embodiment of the present disclosure, as illustrated in FIGS. 4a and 4b, the voltage stabilization module 23 may specifically be a capacitor C1, in which one electrode of the capacitor C1 is the first terminal 31 of the voltage stabilization module 23 and the other electrode of the capacitor C1 is the second terminal 32 of the voltage stabilization module 23.

Specifically, in the above gate drive circuit provided by the embodiment of the present disclosure, upon receipt of the gate drive signal by the input module, the capacitor begins to be charged and the potential of the maintaining node is changed to be equal to the potential of the gate drive signal. Thereafter, the input module is disconnected, and the maintaining node is maintained at the potential of the gate drive signal due to the function of the voltage stabilization capacitor until the reset module provides the reference signal to the maintaining node to discharge the capacitor; then, the maintaining node is maintained at the potential of the reset signal until the input module receives the gate drive signal again.

The above only exemplifies the specific structure of the voltage stabilization module in the voltage maintaining unit. In a specific implementation, the specific structure of the voltage stabilization module is not limited to the above structure provided by the embodiment of the present disclosure, may also be other structures known by those skilled in the art and is not limited herein.

Optionally, in the above gate drive circuit provided by the embodiment of the present disclosure, as illustrated in FIGS. 4a and 4b, the reset module 22 may specifically include a second switching transistor M2, in which a gate of the second switching transistor M2 is the control terminal 2a of the reset module 22, a source of the second switching transistor M2 is the input terminal 2b of the reset module 22, and a drain of the second switching transistor M2 is the output terminal 2c of the reset module 22.

Specifically, in the above gate drive circuit provided by the embodiment of the present disclosure, the second switching transistor is in a turned-on state upon receipt of the gate drive signal by the control terminal thereof, and thus provides the reference signal at the input terminal to the pull-up node, so that the potential of the pull-up node is changed to be equal to the potential of the reference signal.

Specifically, in the above gate drive circuit provided by the embodiment of the present disclosure, as illustrated in FIG. 4a, when the potential of the gate drive signal is high, the second switching transistor M2 is an N-type transistor, and, as illustrated in FIG. 4b, when the potential of the gate drive signal is low, the second switching transistor M2 is a P-type transistor.

The above only exemplifies the specific structure of the reset module in the voltage maintaining unit. In a specific implementation, the specific structure of the reset module is not limited to the above structure provided by the embodiment of the present disclosure, may also be other structures known by those skilled in the art and is not limited herein.

Based on the same inventive idea, an embodiment of the present disclosure further provides a display panel including any one of the above gate drive circuits provided by the embodiment of the present disclosure. Since the principle by which the display panel solves the problem is similar to that of the gate drive circuit as describe above, the implementation of the display panel may refer to the implementation of the above gate drive circuit, and the descriptions will not be repeated for avoiding redundancy.

Further, the above display panel provided by the embodiment of the present disclosure further includes multiple touch scan lines and a touch scan circuit connected with respective touch scan lines, the display panel being divided into N regions along the scan direction of the touch scan lines, each of regions having multiple touch scan lines, and N equaling to the number of stages of gate drive sub-circuits in the display panel.

The touch scan circuit is used to output, after a shift register of a last stage in the gate drive sub-circuit of the n-th stage outputs the gate drive signal and before a shift register of a first stage in the gate drive sub-circuit of the (n+1)-th stage outputs the gate drive signal, a touch scan signal to touch scan lines in the n-th region in sequence, and to output the touch scan signal to touch scan lines in the N-th region in sequence after a shift register of a last stage in the gate drive sub-circuit of the N-th stage outputs the gate drive signal, n being a positive integer greater than 0 and less than N.

Optionally, in the above display panel provided by the embodiment of the present disclosure, the numbers of shift registers in gate drive sub-circuits of respective stages are same and are not limited herein.

Optionally, in the above display panel provided by the embodiment of the present disclosure, the numbers of touch scan lines in respective regions are same and are not limited herein.

Figure 5:
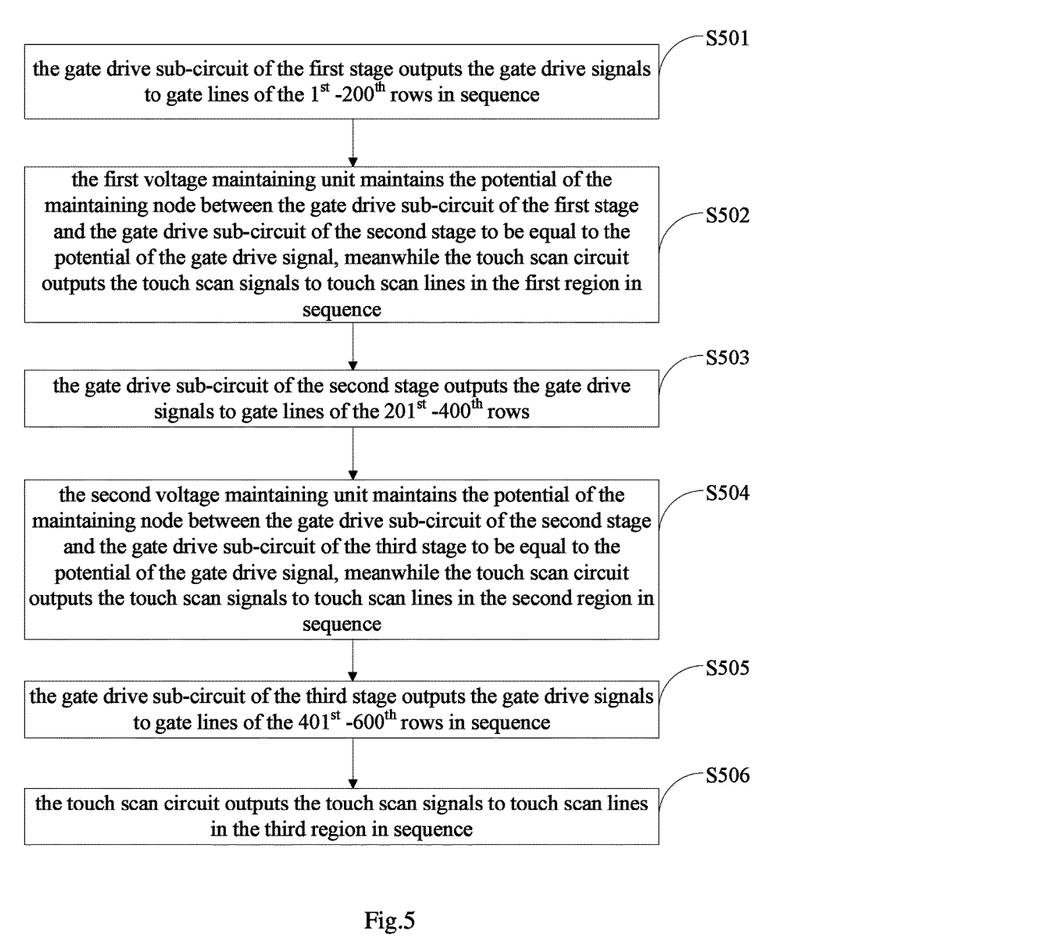
FIG. 5 is a schematic diagram of the driving flow of a display panel provided by an embodiment of the present disclosure.

In the following, the above display panel provided by the embodiment of the present disclosure will be explained by way of a specific embodiment. It is assumed that the display panel has 600 gate lines in total and that there are 3 gate drive sub-circuits and 2 voltage maintaining units in the gate drive circuit, wherein the gate drive sub-circuit of each stage corresponds to 200 gate lines, and the display panel is divided into 3 regions along the touch scan direction with each of regions having n touch scan lines. As illustrated in FIG. 5, the driving flowchart of the display panel may specifically include the following steps.

At step S501, the gate drive sub-circuit of the first stage outputs the gate drive signal to gate lines of the $1^{st}$ to $200^{th}$ rows in sequence.

At step S502, the first voltage maintaining unit maintains the potential of the maintaining node between the gate drive sub-circuit of the first stage and the gate drive sub-circuit of the second stage equal to the potential of the gate drive signal, meanwhile the touch scan circuit outputs the touch scan signal to touch scan lines in the first region in sequence.

At step S503, the gate drive sub-circuit of the second stage outputs the gate drive signal to gate lines of the $201^{th}$ to $400^{th}$ rows.

At step S504, the second voltage maintaining unit maintains the potential of the maintaining node between the gate drive sub-circuit of the second stage and the gate drive sub-circuit of the third stage equal to the potential of the gate drive signal, meanwhile the touch scan circuit outputs the touch scan signal to touch scan lines in the second region in sequence.

At step S505, the gate drive sub-circuit of the third stage outputs the gate drive signal to gate lines of the $401^{th}$ to $600^{th}$ rows in sequence.

At step S506, the touch scan circuit outputs the touch scan signal to touch scan lines in the third region in sequence.

With the above six steps, the scanning of all of gate lines and the scanning of all of touch scan lines in the entire display panel are implemented, and thus a function of time division scanning for display and touch of the display panel is realized.

Figure 6:
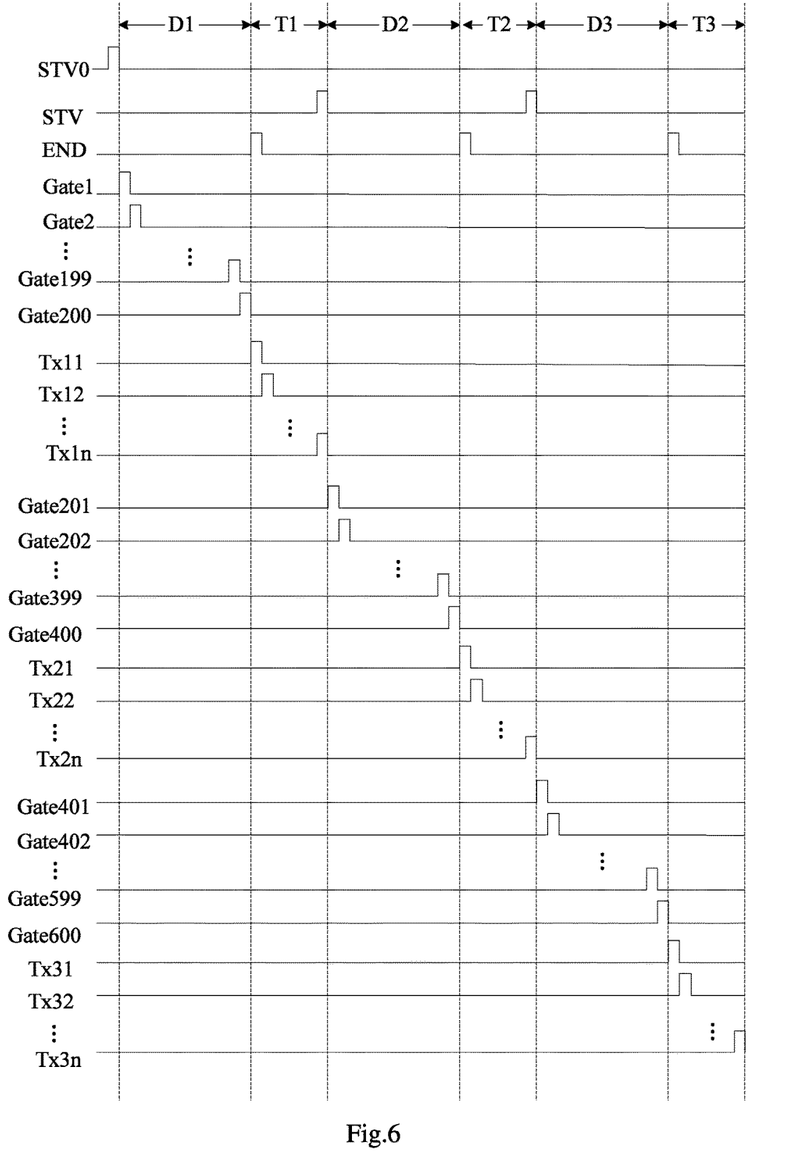
FIG. 6 is a circuit timing diagram of the display panel corresponding to FIG. 5.

Specifically, FIG. 6 is a drive timing diagram corresponding to FIG. 5. The time for the display panel to display each frame (V-sync) is divided into a display the period (Display) and a touch the period (Touch), meanwhile the display the period is divided into three the periods, i.e. D1, D2 and D3, and the touch the period is divided into three the periods, i.e. T1, T2 and T3. During the period D1, after the input signal terminal Input of the shift register of the first stage in the gate drive sub-circuit of the first stage receives the input signal, the gate drive sub-circuit of the first stage outputs the gate drive signal to gate lines Gate1, Gate2 . . . Gate200 of the $1^{st}$ to $200^{th}$ rows of the display panel in sequence, so that the display function of gate lines of the $1^{st}$ to $200^{th}$ rows is implemented. During the period T1, the gate drive sub-circuit of the first stage pauses its operation, and touch scan lines Tx11 . . . Tx1n in the first region output the touch scan signal in sequence, so that the touch function of the first region is implemented. After the input signal terminal Input of the shift register of the first stage in the gate drive sub-circuit of the second stage receives the input signal, the period T1 ends. The period D2 starts, the gate drive sub-circuit of the second stage outputs the gate drive signal to gate lines Gate201, Gate202 . . . Gate400 of the $201^{th}$ to $400^{th}$ rows of the display panel in sequence, so that the display function of gate lines of $201^{th}$ to $400^{th}$ rows is implemented. During the period T2, the gate drive sub-circuit of the second stage pauses its operation, and touch scan lines Tx21 . . . Tx2n in the second region output the touch scan signal in sequence, so that the touch function of the second region is implemented. After the input signal terminal Input of the shift register of the first stage in the gate drive sub-circuit of the third stage receives the input signal, the period T2 ends. The period D3 starts, the gate drive sub-circuit of the third stage outputs the gate drive signal to gate lines Gate401, Gate402 . . . Gate600 of the $401^{th}$ to $600^{th}$ rows of the display panel in sequence, so that the display function of gate lines of the $401^{th}$ to $600^{th}$ rows is implemented. During the period T3, the gate drive sub-circuit of the third stage pauses its operation, and touch scan lines Tx31 . . . Tx3n in the third region output the touch scan signal in sequence, so that the touch function of the third region is implemented.

Based on the same inventive idea, an embodiment of the present disclosure provides a touch display apparatus including the above display panel provided by the embodiment of the present disclosure. The touch display apparatus may be applied to any products or components that having a display function and a touch function, such as a mobile phone, a tablet computer, a TV set, a display, a notebook computer, a digital photo frame, a navigator, etc. Since the principle by which the touch display apparatus solves the problem is similar to that of the display panel, the implementation of the touch display apparatus may refer to the implementation of the above display panel, and the description will not be repeated for avoiding redundancy.

In the gate drive circuit, the display panel and the display apparatus provided by the embodiments of the present disclosure, since the voltage maintaining unit is arranged between gate drive sub-circuits of two adjacent stages to maintain, after the shift register of the last stage in the gate drive sub-circuit of the previous stage connected thereto outputs the gate drive signal and before the shift register of the first stage in the gate drive sub-circuit of the next stage connected thereto outputs the gate drive signal, the potential of the input signal control terminal of the shift register of the first stage in the gate drive sub-circuit of the next stage to be equal to the potential of the gate drive signal, it is assured, in the gate drive circuit, the potential of the input signal control terminal of the shift register of the first stage in the gate drive sub-circuit of the next stage cannot be attenuated with time regardless how long the time interval between the timings at which the gate drive sub-circuits of two adjacent stages output gate drive signals is; instead, the potential of the input signal control terminal thereof is maintained at the potential of the gate drive signal. Thereby, it is assured that respective gate drive sub-circuits in the gate drive circuit can output the signals normally.

Apparently, those skilled in the art may make various modifications and variations to the present disclosure without departing from the spirit and scope of the present disclosure. In this way, if these modifications and variations of the present disclosure belong to the scope of claims of the present disclosure and equivalent techniques thereof, the present disclosure is intended to contain these modifications and variations.

The present application claims the priority of a Chinese patent application No. 201510229369.4 submitted on May 7, 2015, the full content disclosed by which is referenced hereby as a part of the present application.

What is claimed is:

1. A gate drive circuit comprising gate drive sub-circuits of at least two stages, the gate drive sub-circuit of each stage comprising a plurality of shift registers connected in cascade, wherein, in the gate drive sub-circuit of each stage, signal output terminals of shift registers of respective stages output gate drive signals in sequence after a shift register of a first stage receives an input signal input from a corresponding input signal terminal, wherein in the gate drive sub-circuit of each stage except a last stage, a signal output terminal of a shift register of a last stage is connected with an input signal control terminal of a shift register of a first stage in a gate drive sub-circuit of a next stage adjacent thereto via a voltage maintaining unit, wherein the voltage maintaining unit is configured to maintain, after a shift register of a last stage in the gate drive sub-circuit of a previous stage connected thereto outputs a gate drive signal and before a shift register of a first stage in the gate drive sub-circuit of the next stage connected thereto outputs the gate drive signal, the potential of an input signal control terminal of the shift register of the first stage in the gate drive sub-circuit of the next stage to be equal to the potential of the gate drive signal;

when the potential of the input signal control terminal of the shift register of each stage is equal to the potential of the gate drive signal, the shift register of each stage receives the input signal input from the corresponding input signal terminal, the voltage maintaining unit comprises an input module, a voltage stabilization module and a reset module, wherein a control terminal and an input terminal of the input module are both connected with the signal output terminal of the shift register of the last stage in the gate drive sub-circuit of the previous stage, and an output terminal of the input module is connected with a maintaining node, the maintaining node being connected with the input signal control terminal of the shift register of the first stage in the gate drive sub-circuit of the next stage; the input module is configured to provide, when the control terminal and the input terminal thereof receive the gate drive signal, the gate drive signal to the maintaining node;

a control terminal of the reset module is connected with the signal output terminal of the shift register of the first stage in the gate drive sub-circuit of the next stage, an input terminal of the reset module is connected with a reference signal terminal, and an output terminal of the reset module is connected with the maintaining node; the reset module is configured to provide, when the control terminal thereof receives the gate drive signal, a reference signal to the maintaining node;

a first terminal of the voltage stabilization module is connected with the maintaining node, and a second terminal of the voltage stabilization module is connected with the reference signal terminal; the voltage stabilization module is configured to maintain, after the maintaining node receives the gate drive signal and before the maintaining node receives the reference signal, the potential of the maintaining node to be equal to the potential of the gate drive signal.

2. The gate drive circuit according to claim 1, wherein the input module comprises a first switching transistor, wherein
a gate of the first switching transistor is the control terminal of the input module, a source of the first switching transistor is the input terminal of the input module, and a drain of the first switching transistor is the output terminal of the input module.

3. The gate drive circuit according to claim 2, wherein the first switching transistor is an N-type transistor in a case that an active potential of the gate drive signal is high, and is a P-type transistor in a case that the active potential of the gate drive signal is low.

4. The gate drive circuit according to claim 1, wherein the voltage stabilization module is a capacitor, wherein
one electrode of the capacitor is the first terminal of the voltage stabilization module, and the other electrode of the capacitor is the second terminal of the voltage stabilization module.

5. The gate drive circuit according to claim 1, wherein the reset module comprises a second switching transistor, wherein
a gate of the second switching transistor is the control terminal of the reset module, a source of the second switching transistor is the input terminal of the reset module, and a drain of the second switching transistor is the output terminal of the reset module.

6. The gate drive circuit according to claim 5, wherein the second switching transistor is an N-type transistor in a case that an active potential of the gate drive signal is high, and is a P-type transistor in a case that the active potential of the gate drive signal is low.

7. The gate drive circuit according to claim 1, wherein the potential of the reference signal terminal is low in a case that an active potential of the gate drive signal is high, and is high in a case that the active potential of the gate drive signal is low.

8. The gate drive circuit according to claim 1, wherein in the gate drive sub-circuit of each stage,
the signal output terminal of the shift register of each stage except the first stage is connected with the reset signal terminal of the shift register of a previous stage adjacent thereto;
the signal output terminal of the shift register of each stage except the last stage is connected with the input signal control terminal and the input signal terminal of the shift register of a next stage adjacent thereto;
the input signal terminal corresponding to the shift register of the first stage is connected with a start signal terminal, and the reset signal terminal of the shift register of the last stage is connected with a termination signal terminal.

9. A display panel comprising the gate drive circuit according to claim 1.

10. The display panel according to claim 9, further comprising a plurality of touch scan lines and a touch scan circuit connected with respective touch scan lines; wherein the display panel is divided into N regions along a scan direction of the touch scan lines, and each of regions has a plurality of touch scan lines, N equaling to the number of stages of gate drive sub-circuits in the display panel;

the touch scan circuit is configured to output, after a shift register of a last stage in the gate drive sub-circuit of an $n^{th}$ stage outputs a gate drive signal and before a shift register of a first stage in the gate drive sub-circuit of a $(n+1)^{th}$ stage outputs the gate drive signal, touch scan signals to touch scan lines in the $n^{th}$ region in sequence, and to output the touch scan signals to touch scan lines in an $N^{th}$ region in sequence after a shift register of a last stage in the gate drive sub-circuit of the $N^{th}$ stage outputs the gate drive signal, n being a positive integer greater than 0 and less than N.

11. A touch display apparatus comprising the display panel according to claim 9.

12. The display panel according to claim 11, wherein the input module comprises a first switching transistor, wherein
a gate of the first switching transistor is the control terminal of the input module, a source of the first switching transistor is the input terminal of the input module, and a drain of the first switching transistor is the output terminal of the input module.

13. The display panel according to claim 11, wherein the voltage stabilization module is a capacitor, wherein
one electrode of the capacitor is the first terminal of the voltage stabilization module, and the other electrode of the capacitor is the second terminal of the voltage stabilization module.

14. The display panel according to claim 11, wherein the reset module comprises a second switching transistor, wherein
a gate of the second switching transistor is the control terminal of the reset module, a source of the second switching transistor is the input terminal of the reset module, and a drain of the second switching transistor is the output terminal of the reset module.

15. The display panel according to claim 9, wherein in the gate drive sub-circuit of each stage,
the signal output terminal of the shift register of each stage except the first stage is connected with the reset signal terminal of the shift register of a previous stage adjacent thereto;
the signal output terminal of the shift register of each stage except the last stage is connected with the input signal control terminal and the input signal terminal of the shift register of a next stage adjacent thereto;
the input signal terminal corresponding to the shift register of the first stage is connected with a start signal terminal, and the reset signal terminal of the shift register of the last stage is connected with a termination signal terminal.

16. The touch display apparatus according to claim 11, wherein the display panel further comprises a plurality of touch scan lines and a touch scan circuit connected with respective touch scan lines; wherein the display panel is divided into N regions along a scan direction of the touch scan lines, and each of regions has a plurality of touch scan lines, N equaling to the number of stages of gate drive sub-circuits in the display panel;
the touch scan circuit is configured to output, after a shift register of a last stage in the gate drive sub-circuit of an $n^{th}$ stage outputs a gate drive signal and before a shift register of a first stage in the gate drive sub-circuit of a $(n+1)^{th}$ stage outputs the gate drive signal, touch scan signals to touch scan lines in the $n^{th}$ region in sequence, and to output the touch scan signals to touch scan lines in an $N^{th}$ region in sequence after a shift register of a last stage in the gate drive sub-circuit of the Nth stage outputs the gate drive signal, n being a positive integer greater than 0 and less than N.

\* \* \* \* \*